(12) United States Patent
Nishikawa (10) Patent No.: US 7,719,859 B2
(45) Date of Patent: May 18, 2010

(54) SWITCHING POWER SUPPLY DEVICE AND DRIVE CIRCUIT THEREOF

(75) Inventor: Yukihiro Nishikawa, Hino (JP)

(73) Assignee: Fuji Electric Device Technology Co., Ltd. (JP)

( * ) Notice: Subject to any disclaimer, the term of this patent is extended or adjusted under 35 U.S.C. 154(b) by 346 days.

(21) Appl. No.: 11/934,777

(22) Filed: Nov. 4, 2007

(65) Prior Publication Data

US 2008/0112192 A1      May 15, 2008

(30) Foreign Application Priority Data

Nov. 10, 2006  (JP)  ............................... 2006-305197

(51) Int. Cl.
*H02M 3/335* (2006.01)
(52) U.S. Cl. ........................ 363/17; 363/21.14; 323/222
(58) Field of Classification Search ............. 363/17–20, 363/21.06, 21.12, 21.14, 21.16, 97, 98, 132; 323/222, 271, 282–286; 315/224, 291, 307; 327/538
See application file for complete search history.

(56) References Cited

U.S. PATENT DOCUMENTS

| | | | | |
|---|---|---|---|---|
| 5,640,110 A | * | 6/1997 | Niratsuka et al. ........... | 327/108 |
| 6,483,722 B2 | * | 11/2002 | Nozawa et al. ................ | 363/17 |
| 6,842,353 B2 | * | 1/2005 | Yamada et al. ................ | 363/89 |
| 7,054,167 B2 | * | 5/2006 | Yasumura ..................... | 363/16 |
| 7,116,562 B2 | | 10/2006 | Takashima et al. | |
| 7,170,761 B2 | * | 1/2007 | Yasumura ..................... | 363/17 |

FOREIGN PATENT DOCUMENTS

| | | |
|---|---|---|
| JP | 2001-224171 A | 8/2001 |
| JP | 2002-209381 A | 7/2002 |
| JP | 2004-173396 A | 6/2004 |
| JP | 2006-109566 A | 4/2006 |

* cited by examiner

*Primary Examiner*—Rajnikant B Patel
(74) *Attorney, Agent, or Firm*—Rossi, Kimms & McDowell LLP (57) ABSTRACT

A switching power supply device has a drive circuit that can minimize a loss while being compact. The drive circuit turns on and off a high-side switching element (MOSFET) according to a positive or negative voltage developed at a tertiary winding of a transformer. The drive circuit includes a control unit that detects the development time, during which the negative voltage is developed at the tertiary winding, as the on time of a low-side switching element, and makes the on time of the high-side switching element nearly or substantially equal to the development time.

9 Claims, 9 Drawing Sheets

SWITCHING POWER SUPPLY DEVICE AND DRIVE CIRCUIT THEREOF

BACKGROUND

Figure 14:
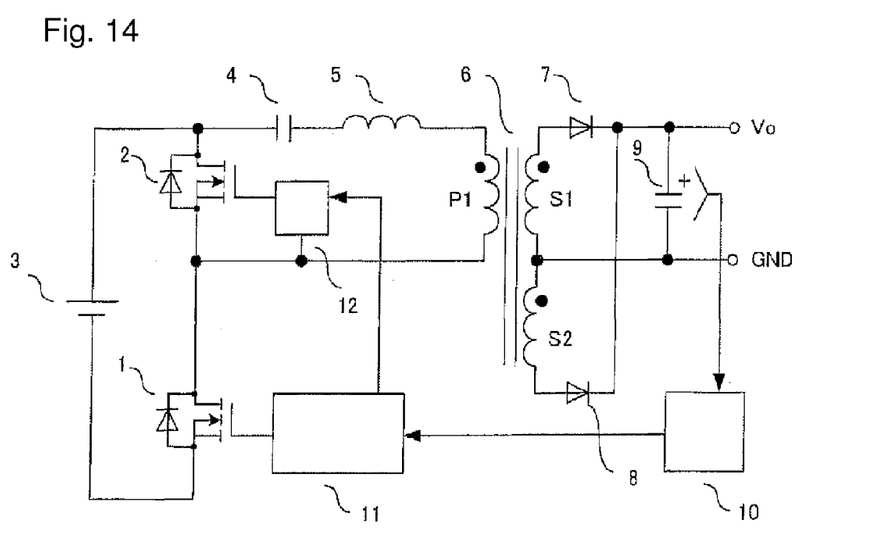
FIG. 14 is a circuit diagram showing the first related art.

FIG. 14 shows an embodiment of a DC-DC converter similar to the one disclosed, for example, in JP-A-2001-224171 (pages 7 and 8 and FIG. 1). As illustrated, a series circuit, including a metal oxide semiconductor field-effect transistor (MOSFET) 1 and a MOSFET 2, is connected in parallel with a direct current (DC) power supply 3. A series circuit, including a capacitor 4, an inductor 5, and a primary winding P1 of a transformer 6, is connected in parallel with the MOSFET 2. Diodes 7, 8 and a capacitor 9 that rectify and smooth a positive or negative voltage developed at secondary windings S1 and S2 of a transformer 6 are connected to the secondary windings. A series circuit, including the capacitor 4, inductor 5, and primary winding P1 of the transformer 6 is connected in parallel with the MOSFET 1. The inductor 5, which is connected in series with the primary winding P1, can be substituted with the leakage inductance of the transformer 6.

A feedback signal is transferred to a control circuit 11 via a voltage detection circuit 10 to keep a voltage V0 across the capacitor 9 constant. The control circuit 11 includes a comparison circuit that compares the feedback signal with a predetermined value, and a pulse generator that generates a gate pulse to be fed to the MOSFET 1 based on the results of the comparison.

In FIG. 14, the control circuit 11 and a drive circuit 12 alternately turns on and off the MOSFETs 1 and 2 at a duty cycle of 50%. An output voltage is regulated by varying the driving frequency for the MOSFETs 1 and 2. An integrated circuit (IC) capable of withstanding a high voltage and having a level shift capability can be used as a means for transferring a signal, with which the MOSFET 2 on a high-potential side (hereinafter high-side) is turned on or off, from the control circuit 11 to the drive circuit 12. However, since the IC capable of withstanding a high voltage is relatively expensive, the use of the IC increases the overall cost of a switching power supply device.

Figure 15:
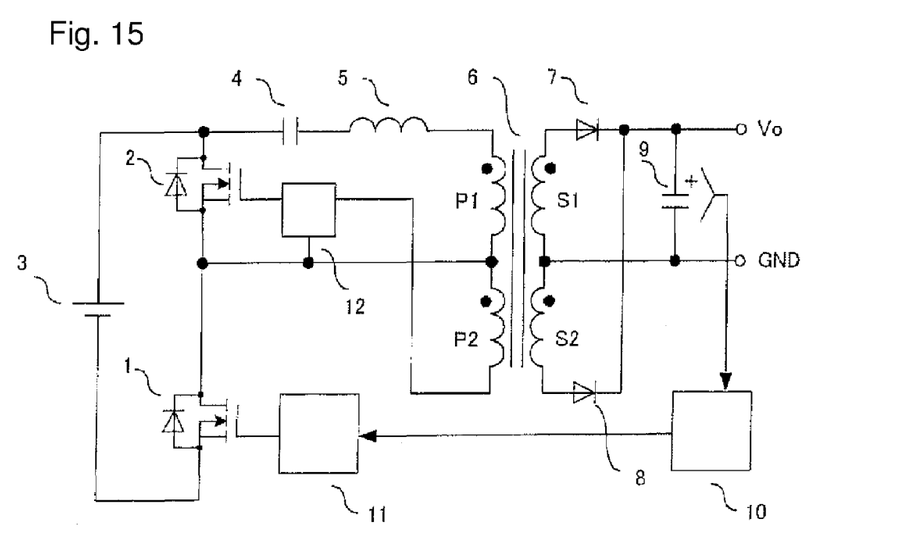
FIG. 15 is a circuit diagram showing the second related art.

FIG. 15 shows an embodiment similar to the one disclosed, for example, in JP-A-2002-209381 (page 4 and FIG. 1) (refer to column 4, lines 10-23, and FIG. 1 of corresponding U.S. Pat. No. 6,483,722), that can reduce the cost. In the illustrated embodiment, the transformer 6 has a tertiary winding P2, and the high-side MOSFET 2 is driven via the drive circuit 12 according to a positive or negative voltage developed at the tertiary winding P2. In JP-A-2002-209381, the drive circuit 12 includes a resistor. The low-potential side (hereinafter low-side) MOSFET 1 is driven so that it is turned on after the MOSFET 2 is turned off. Thus, the two MOSFETs are alternately turned on and off. Owing to the foregoing configuration, the control circuit 11 can employ an inexpensive IC capable of withstanding a low voltage. Consequently, the cost of the switching power supply device can be reduced.

In the circuitry shown in FIG. 15, the on time of the MOSFET 2 is determined with a voltage developed at the tertiary winding P2 of the transformer 6. The on times of the MOSFET 1 and MOSFET 2 are usually different from each other. Consequently, current flowing through the MOSFETs 1 and 2 and current flowing through the rectification diodes 7 and 8 are unbalanced. This, however, undesirably increases the losses occurring in the MOSFETs and rectification diodes.

In particular, when a main AC voltage is rectified and smoothed as a DC supply voltage to be fed from the DC power supply 3, since the AC voltage varies within a certain range, the ratio of the maximum value of the DC supply voltage to the minimum value thereof gets almost doubled. The higher the DC supply voltage is, the more remarkable the unbalance between the currents flowing through the MOSFETs and rectification diodes becomes.

Accordingly, there remains a need for an improved switching power supply device, or more particularly, to a technology for designing a half-bridge direct current-to-direct current (DC-DC) converter, that can resolve the unbalance between the currents flowing through MOSFETs and the currents flowing through rectification diodes so as to thus minimize losses, as well as being compact and low-cost. The present disclosure addresses this need.

SUMMARY OF THE INVENTION

The present invention relates to a switching power supply device and a drive circuit thereof.

One aspect of the present invention is the switching power supply device. The device can include a first switching element adapted to be connected to a negative electrode of a DC power supply, a second switching element connected to the first switching element and adapted to be connected to a positive electrode of the DC power supply, a transformer including a primary winding, a secondary winding, and a tertiary winding, and a series circuit, including a capacitor, an inductor, and the primary winding connected in series, connected in parallel with one of the first switching element or the second switching element, adapted to rectify and smooth a positive or negative voltage developed at the secondary winding by alternately turning on and off the first switching element and second switching element and provide a DC output. The device further includes a drive circuit adapted to turn on or off the second switching element according to a positive or negative voltage developed at the tertiary winding. The drive circuit includes a control unit adapted to detect a development time, during which the negative voltage is developed at the tertiary winding, as the on time of the first switching element, and make the on time of the second switching element become substantially equal to the on time of the first switching element.

The control unit can include at least one constant current circuit and a timer capacitor, charges or discharges the timer capacitor according to the positive or negative voltage developed at the tertiary winding, and controls the turning off timing of the second switching element based on the voltage at the terminals of the timer capacitor. The control unit can include a setting means for setting the minimum value of the on time of the high-side switching element.

Another aspect of the present invention is the drive circuit for a switching power supply device having a half-bridge configuration.

DETAILED DESCRIPTION

Figure 1:
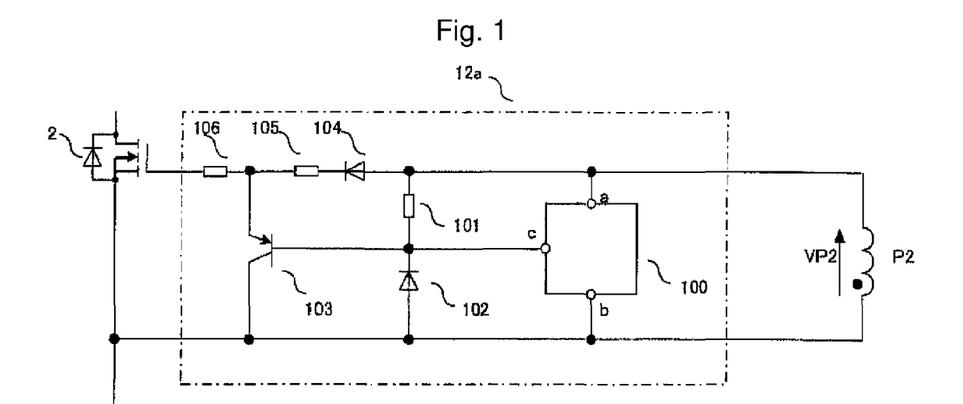
FIG. 1 is a circuit diagram showing an embodiment according to the present invention.

FIG. 1, which is a circuit diagram showing an embodiment according to the present invention, illustrates a major portion of a switching power supply device. Specifically, the power supply device according to the present invention incorporates a half-bridge direct current-to-direct current (DC-DC) converter and can resolve the unbalance between the currents flowing through MOSFETs and the currents flowing through rectification diodes to minimize losses, while making the device compact and economical.

The switching power supply device according to the present invention can incorporate the device illustrated in FIG. 15, with a drive circuit 12a according to the present replacing or substituting the drive circuit 12. The drive circuit 12a can include resistors 101, 105, 106, diodes 102, 104, a PNP transistor 103, and a control unit 100. When a voltage VP2 developed at a tertiary winding P2 of the transformer 6 exceeds a gate threshold for the MOSFET 2, the drive circuit 12a turns on the MOSFET 2. When the voltage VP2 falls below the gate threshold for the MOSFET 2, the drive circuit 12a turns off the MOSFET 2.

The control unit 100 controls the turning off timing of the MOSFET 2. The PNP transistor 103 is turned on at a timing designated by the control unit 100. Thus, the charge stored due to the gate input capacitance of the MOSFET 2 can be quickly discharged to turn off the MOSFET 2. Specifically, whichever of the timing when the voltage VP2 developed at the tertiary winding P2 falls below the gate threshold for the MOSFET 2, or the timing designated by the control unit 100 comes earlier, the MOSFET 2 is turned off at the earlier timing.

Figure 2:
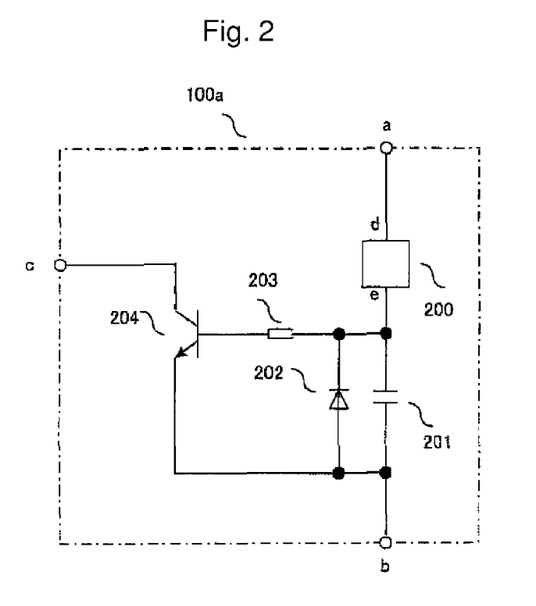
FIG. 2 is a circuit diagram showing an embodiment of a control unit shown in FIG. 1.

FIG. 2 shows a specific embodiment 100a of the control unit 100. The control unit 100a includes a capacitor 201, a diode 202, a resistor 203, an NPN transistor 204, and a charge/discharge circuit 200 that charges or discharges the capacitor 201. Charging or discharging is selected based on the polarity of the voltage between terminals a and b. The capacitor 201 is a timer capacitor that is charged or discharged by the charge/discharge circuit.

Figure 3:
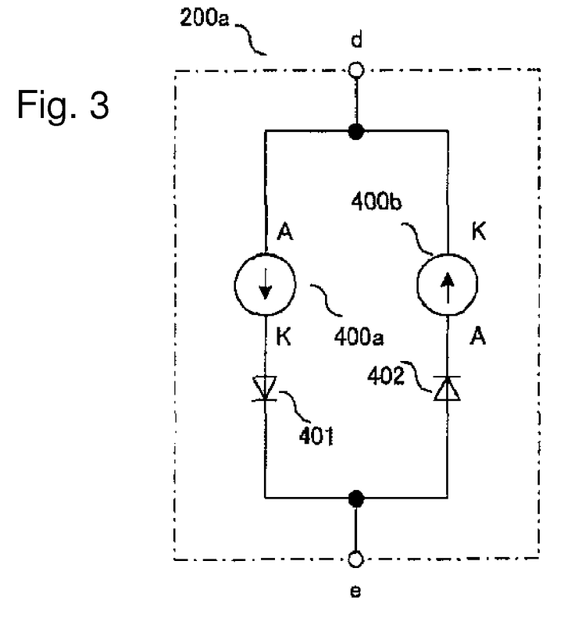
FIG. 3 is a circuit diagram showing an embodiment of a charge/discharge circuit shown in FIG. 2.
Figure 5:
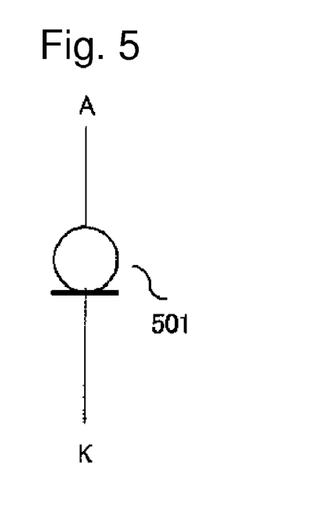
FIG. 5 is a circuit diagram showing an embodiment of a constant current circuit shown in FIG. 3 and FIG. 4.
Figure 6:
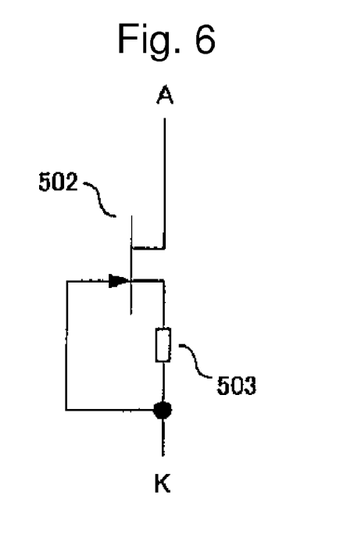
FIG. 6 is a circuit diagram showing another embodiment of the constant current circuit shown in FIG. 3 and FIG. 4.
Figure 7:
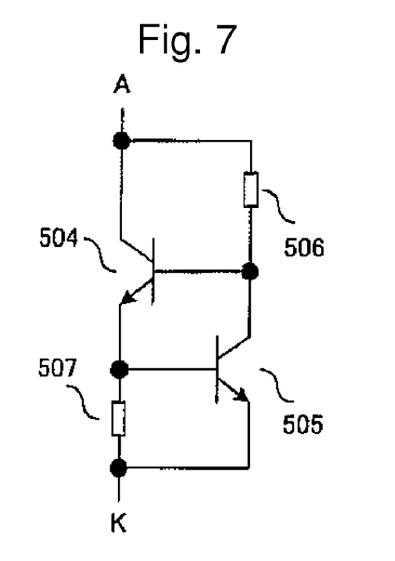
FIG. 7 is a circuit diagram showing still another embodiment of the constant current circuit shown in FIG. 3 and FIG. 4.

FIG. 3 illustrates an embodiment 200a of the charge/discharge circuit 200. The charge/discharge circuit 200a includes constant current circuits 400a, 400b having the circuitry shown in any of FIG. 5 to FIG. 7, and diodes 401, 402. The embodiment of the constant current circuits 400a, 400b shown in FIG. 5 includes a constant current diode 501. The embodiment shown in FIG. 6 includes an N-channel junction field-effect transistor (JFET) 502 and a resistor 503 (the resistance of the resistor 503 can be zero). The embodiment shown in FIG. 7 includes NPN transistors 504, 505 and resistors 506, 507.

Figure 8:
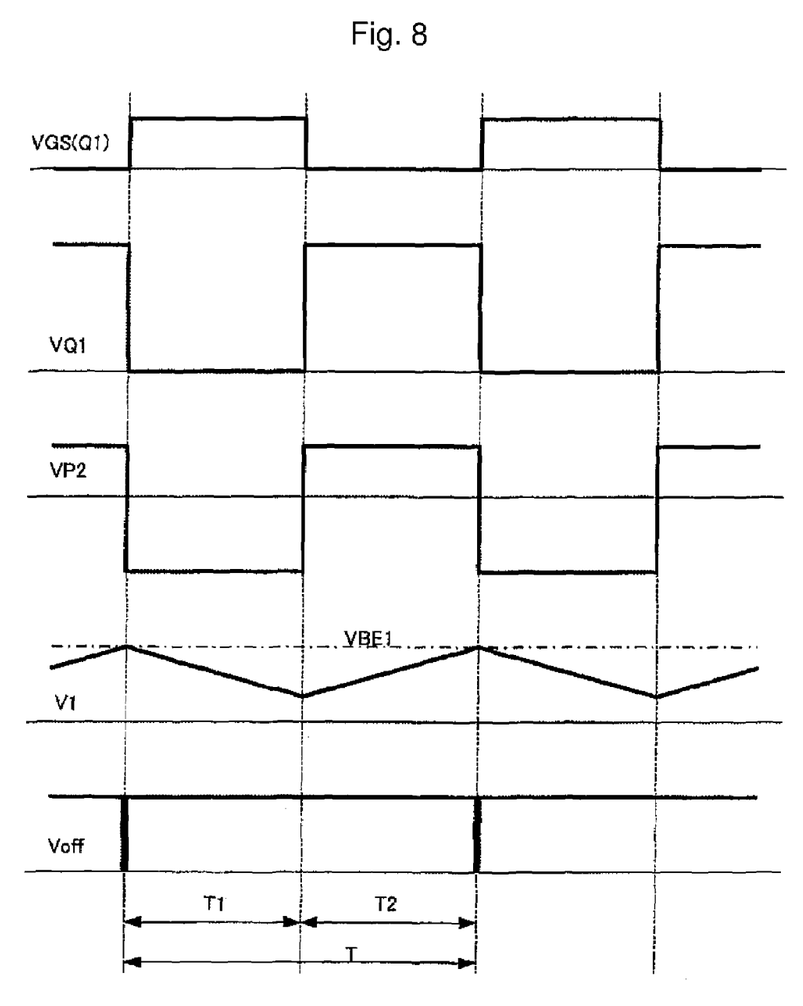
FIG. 8 shows waveforms for use in explaining actions to be performed in the embodiment shown in FIG. 1.

FIG. 8 illustrates actions to be performed in the embodiment shown in FIG. 1, referring to a gate voltage VGS (Q1) of the MOSFET 1, a drain-source voltage VQ1 of the MOSFET 1, a voltage VP2 at the tertiary winding of the transformer 6, a voltage V1 at the terminals of the capacitor 201, and a collector-emitter voltage Voff of the NPN transistor 204. During the on period T1 of the MOSFET 1, a pulse width is controlled (PWM control) so that the output voltage Vo of a DC-DC converter will remain constant. During the on period T1, the voltage VP2 is negative, and the capacitor 201 is discharged with a constant current. When the capacitor 201 is discharged with the constant current, the voltage V1 at the terminals of the capacitor 201 drops as shown in FIG. 8. The drop is equivalent to a value detected during the on period of the MOSFET 1.

Thereafter, when the MOSFET 1 is turned off, the voltage VP2 becomes positive. After a certain dead time elapses, the MOSFET 2 is turned on, and the capacitor 201 is charged with a constant current during the on period T2. When the voltage at the terminals of the capacitor 201 exceeds a base-emitter saturation voltage VBE1 of the NPN transistor 204, the NPN transistor 204 is turned on. Consequently, the PNP transistor 103 shown in FIG. 1 is turned on, and the MOSFET 2 is turned off.

At this time, in case the currents flowing through the constant current circuits 400a and 400b shown in FIG. 3 are set to an equal value, the absolute values of the change rates of the voltage at the terminals of the capacitor 201 observed during periods T1 and T2 respectively become equal to each other, and the widths of the changes in the voltage observed during the periods T1 and T2 respectively shown in FIG. 8 become equalized to each other. In other words, a drop in the voltage at the terminals of the capacitor 201, which drop is equivalent to a value detected during the on period T1 of the MOSFET 1, reaches the voltage VBE1 during the same time as the on period T1. Consequently, the on time T2 of the MOSFET 2 becomes nearly equal or substantially equal to the on time (T1) of the MOSFET 1. Eventually, a total loss caused by the MOSFETs and rectification diodes is minimized.

Figure 4:
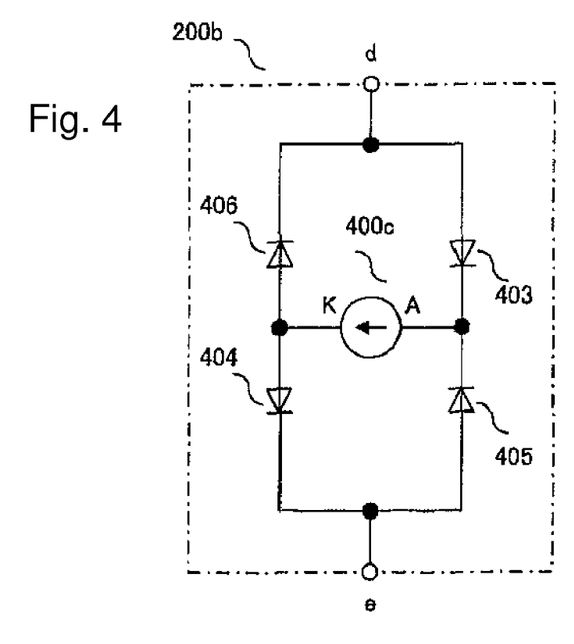
FIG. 4 is a circuit diagram showing another embodiment of the charge/discharge circuit shown in FIG. 2.

Since the currents flowing through the constant current circuits 400a and 400b shown in FIG. 3 are set to the same value, only one constant current circuit 400c can be used instead to form a charge/discharge circuit 200b, such as shown in FIG. 4. Unlike the charge/discharge circuit 200a, the charge/discharge circuit 200b uses four diodes 403-406. However, since the constant current circuit 400c alone is needed, the circuitry is simplified and the cost reduction is easily achieved. Similarly to the charge/discharge circuit 200a shown in FIG. 3, any of the constant current circuitries shown in FIG. 5 to FIG. 7 can be used as the constant current circuit 400c.

Figure 9:
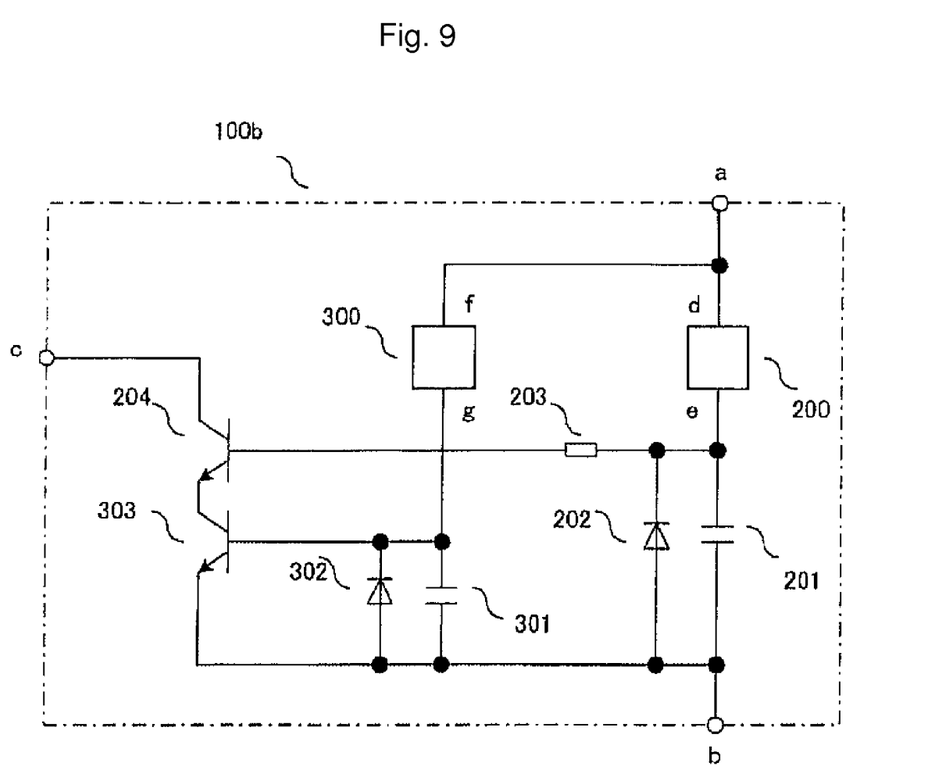
FIG. 9 is a circuit diagram showing another embodiment of the control unit.

FIG. 9 is a circuit diagram showing another embodiment 100b of the control unit 100. In this embodiment, a charge/discharge circuit 300, a capacitor 301, a diode 302, and an NPN transistor 303 are added to the control unit 100a shown in FIG. 2. In the circuitry shown in FIG. 15, the lighter the load connected to the DC output terminal of a DC-DC converter is, the shorter the on time T1 of the MOSFET 1 becomes. Accordingly, the on time T2 of the MOSFET 2 gets shorter. Eventually, a driving frequency gets higher, and the efficiency in conversion of the DC-DC converter becomes degraded. Therefore, the control unit 100b is designed to restrict the minimum value of the on time T2 of the MOSFET 2 to a value Tmin. Thus, the driving frequency is restricted to a value 1/Tmin, and the degradation in the conversion efficiency of the DC-DC converter can be suppressed.

Figure 10:
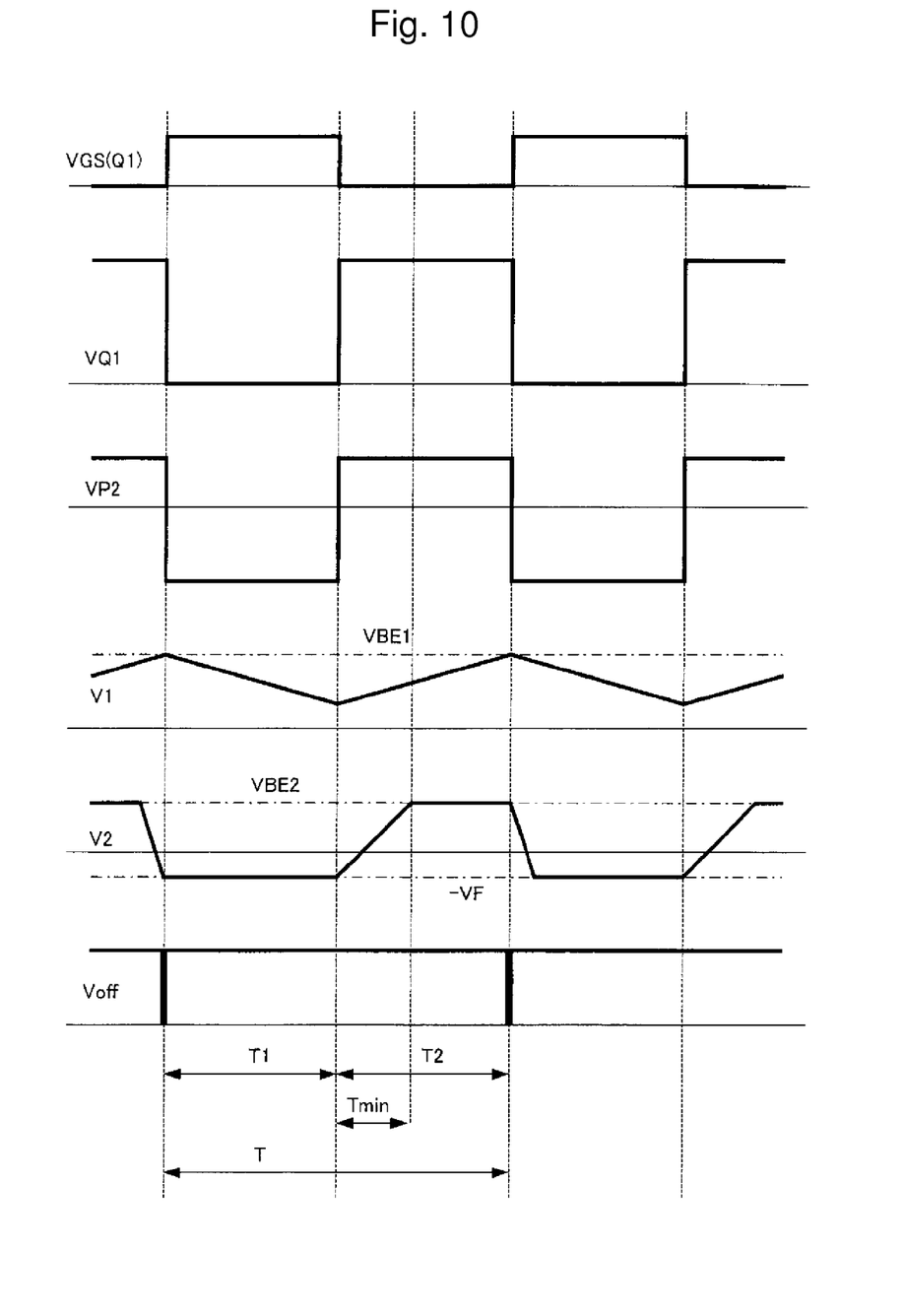
FIG. 10 shows waveforms for use in explaining actions (part 1) to be performed in the control unit shown in FIG. 9.
Figure 11:
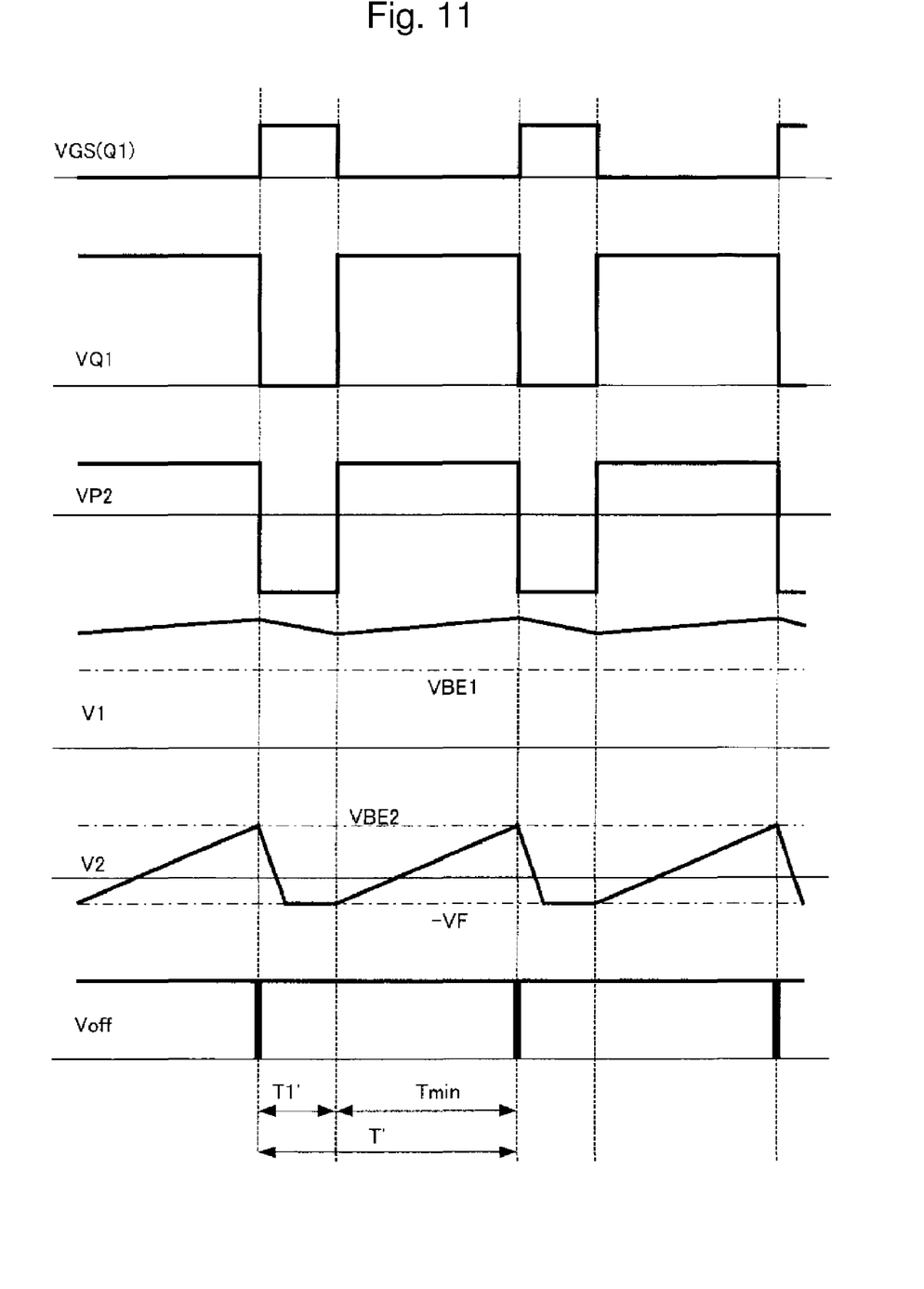
FIG. 11 shows waveforms for use in explaining actions (part 2) to be performed in the control unit shown in FIG. 9.

FIGS. 10 and 11 illustrate actions to be performed in the control unit shown in FIG. 9. FIG. 10 shows waveforms signifying actions to be performed in a case where the on time T1 of the MOSFET 1 is longer than the time Tmin. FIG. 11 shows waveforms signifying actions to be performed in a case where the on time T1 of the MOSFET 1 is shorter than the time Tmin. Incidentally, the waveforms shown in FIG. 10 and FIG. 11 represent the same voltages as those shown in FIG. 8. The voltage V2 represents the voltage at the terminals of the capacitor 301. In FIG. 10, the voltage VP2 remains negative during the period T1 during which the MOSFET 1 is on. The charge/discharge circuit 300 discharges the capacitor 301 until the voltage across the capacitor 301 drops to the forward voltage (−VF) across the diode 302.

After the MOSFET 1 is turned off, when the voltage VP2 is changed from a negative value to a positive value, the capacitor 301 is charged by the charge/discharge circuit 300 until the voltage at the capacitor becomes equal to the base-emitter saturation voltage VBE2 of the transistor 303. After the voltage at the capacitor 301 reaches the designated Tmin value, the transistor 303 is turned on. The timing when the transistor 204 is turned on next is, similarly to the one in the circuitry shown in FIG. 2, the timing when the voltage at the capacitor 201 reaches the base-emitter saturation voltage VBE1. Consequently, the on time T2 of the MOSFET 2 is nearly equal to the on time T1.

On the other hand, as shown in FIG. 11, when the on time T1 of the MOSFET 1 is shorter than the time Tmin, after the set time Tmin has elapsed since the MOSFET 1 is turned off, the transistor 303 is turned on. A charge time required for the voltage V1 to be developed across the capacitor 201 is longer than a discharge time required therefor. The voltage V1 is therefore higher than the base-emitter saturation voltage VBE1 of the transistor 204. Consequently, when the transistor 303 is turned on, the transistor 204 is turned on at the same time. The on time T2 of the MOSFET 2 equals to the time Tmin, and the driving frequency is restricted to the frequency 1/Tmin.

As mentioned above, when the on time T2 of the MOSFET 2 is restricted to the time Tmin, the on time T1 of the MOSFET 1 is, as denoted by T1' in FIG. 11, shorter than the time Tmin. The current flowing through the MOSFETs 1 and 2 and the current flowing through the rectification diodes 7 and 8 become unbalanced. However, since the load is light, the increase in the loss becomes negligible.

Moreover, when the voltage VP2 at the tertiary winding of the transformer 6 is positive, the charge/discharge circuit 300 charges the capacitor 301. The time elapsing until the voltage at the terminals of the capacitor 301 changes from the forward voltage (−VF) across the diode 302 to the base-emitter saturation voltage VBE2 of the NPN transistor 303 is equal to the time Tmin. In other words, after the time Tmin elapses, both the NPN transistors 303 and 204 are turned on. This causes the MOSFET 2 to be turned off. Moreover, when the voltage VP2 is negative, the capacitor 301 is discharged by the charge/discharge circuit 300 until the voltage across the capacitor 301 becomes equal to the forward voltage (−VF) across the diode 302.

Figure 12:
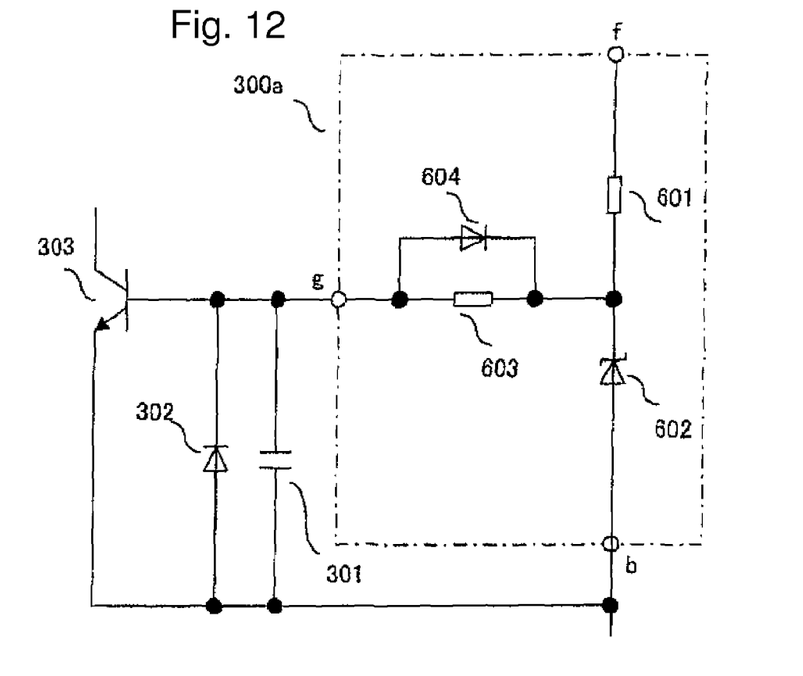
FIG. 12 is a circuit diagram showing an embodiment of a charge/discharge circuit shown in FIG. 9.
Figure 13:
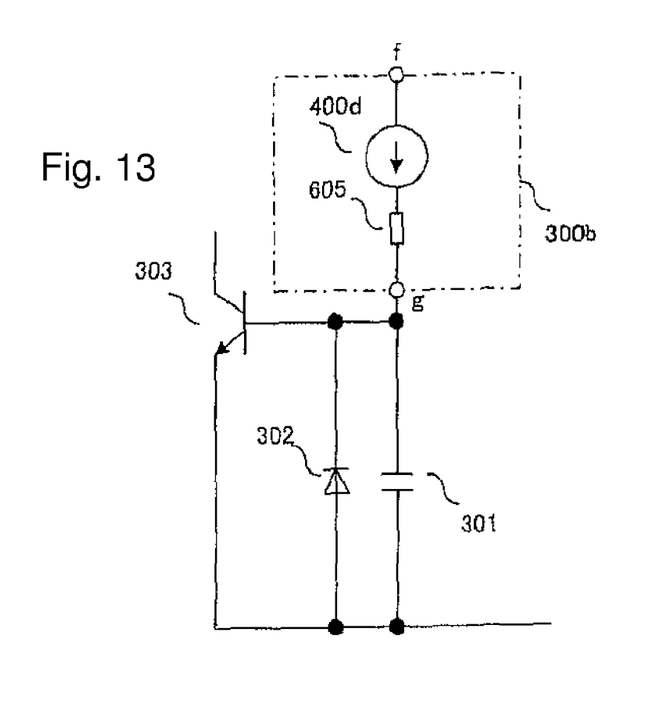
FIG. 13 is a circuit diagram showing another embodiment of the charge/discharge circuit shown in FIG. 9.

The circuitry shown in FIG. 3 can be used as the charge/discharge circuit 300. Since the on time of the MOSFET 1 is shorter than the time Tmin when a light load is imposed, current flowing through the constant current circuit 400b is set to a larger value than that flowing through the constant current circuit 400a. However, since the discharge time for the capacitor 301 need not be precise, a resistor or the like can substitute the constant current circuit. When the driving frequency to be restricted need not be precise, the charge/discharge circuit 300 can have the circuitry 300a shown in FIG. 12 or the circuitry 300b shown in FIG. 13.

The present device can control the on times of the two MOSFETs so that the on times are nearly equal to each other. Consequently, the losses caused by the MOSFETs and rectification diodes can be reduced. Eventually, heat sinks that cool the MOSFET and rectification diodes can be downsized, and the switching power supply device can be made compact and economically.

While the present invention has been particularly shown and described with reference to preferred embodiment thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2006-305197 filed on Nov. 10, 2006. The disclosure of the priority application in its entirety, including the drawings, claims, and the specification thereof, is incorporated herein by reference.

What is claimed is:

1. A switching power supply device comprising:
   a first switching element adapted to be connected to a negative electrode of a DC power supply;
   a second switching element connected to the first switching element and adapted to be connected to a positive electrode of the DC power supply;
   a transformer including a primary winding, a secondary winding, and a tertiary winding;
   a series circuit, including a capacitor, an inductor, and the primary winding connected in series, connected in parallel with one of the first switching element or the second switching element, adapted to rectify and smooth a positive or negative voltage developed at the secondary winding by alternately turning on and off the first switching element and second switching element and provide a DC output; and
   a drive circuit adapted to turn on or off the second switching element according to a positive or negative voltage developed at the tertiary winding,
   wherein the drive circuit includes a control unit adapted to detect a development time, during which the negative voltage is developed at the tertiary winding, as the on time of the first switching element, and make the on time of the second switching element become substantially equal to the on time of the first switching element.

2. The switching power supply device according to claim 1, wherein the control unit includes at least one constant current circuit and a timer capacitor, charges or discharges the timer capacitor according to the positive or negative voltage developed at the tertiary winding, and controls the turning off timing of the second switching element based on the voltage at the terminals of the timer capacitor.

3. The switching power supply device according to claim 1, further comprising setting means for designating the minimum value of the on time of the second switching element.

4. The switching power supply device according to claim 2, further comprising setting means for designating the minimum value of the on time of the second switching element.

5. The switching power supply device according to claim 1, wherein the switching power supply device has a half-bridge configuration.

6. A drive circuit for turning on and off a second switching element according to a positive or negative voltage developed at a tertiary winding of a transformer of a switching power supply device having a half-bridge configuration with a first switching element adapted to be connected to a negative electrode of a DC power supply, the second switching element connected to the first switching element and adapted to be connected to a positive electrode of the DC power supply, the transformer including a primary winding, a secondary winding, and the tertiary winding, and a series circuit, including a capacitor, an inductor, and the primary winding connected in series, connected in parallel with one of the first switching element or the second switching element, adapted to rectify and smooth a positive or negative voltage developed at the secondary winding by alternately turning on and off the first switching element and second switching element and provide a DC output, the drive circuit comprising:

a control unit adapted to detect a development time, during which the negative voltage is developed at the tertiary winding, as the on time of the first switching element, and make the on time of the second switching element become substantially equal to the on time of the first switching element.

7. The driving circuit according to claim 6, wherein the control unit includes at least one constant current circuit and a timer capacitor, charges or discharges the timer capacitor according to the positive or negative voltage developed at the tertiary winding, and controls the turning off timing of the second switching element based on the voltage at the terminals of the timer capacitor.

8. The driving circuit according to claim 6, further comprising setting means for designating the minimum value of the on time of the second switching element.

9. The driving circuit according to claim 7, further comprising setting means for designating the minimum value of the on time of the second switching element.

* * * * *